United States Patent [19]
Winslow

[11] Patent Number: 4,611,318
[45] Date of Patent: Sep. 9, 1986

[54] METHOD AND APPARATUS FOR MONITORING THE STORAGE OF INFORMATION ON A STORAGE MEDIUM

[75] Inventor: John S. Winslow, Altadena, Calif.

[73] Assignee: Discovision Associates, Costa Mesa, Calif.

[21] Appl. No.: 782,170

[22] Filed: Oct. 2, 1985

Related U.S. Application Data

[60] Continuation of Ser. No. 366,123, Apr. 7, 1982, abandoned, which is a continuation of Ser. No. 106,023, Dec. 21, 1979, abandoned, which is a division of Ser. No. 890,407, Mar. 27, 1978, Pat. No. 4,225,873, which is a continuation-in-part of Ser. No. 714,133, Aug. 13, 1976, abandoned, which is a continuation of Ser. No. 508,815, Sep. 24, 1974, abandoned, which is a continuation of Ser. No. 333,560, Feb. 20, 1973, abandoned.

[51] Int. Cl.[4] .................... G11B 27/36; G01D 18/00
[52] U.S. Cl. .................... 369/54; 350/172; 350/397; 346/76 L; 369/58; 369/111
[58] Field of Search ............ 346/108, 76 L, 17; 369/54, 58, 18, 60, 111, 112; 371/71; 350/397, 398

[56] References Cited

U.S. PATENT DOCUMENTS

| | | | |
|---|---|---|---|
| 3,154,370 | 10/1964 | Johnson | 346/108 |
| 3,287,563 | 11/1966 | Clunis | 250/566 |
| 3,365,706 | 1/1968 | King | 365/127 |
| 3,387,109 | 6/1968 | Bruma | 219/69 |
| 3,401,590 | 9/1968 | Massey | 350/157 |
| 3,430,966 | 3/1969 | Gregg | 274/42 |
| 3,438,050 | 4/1969 | Aschenbrenner | 346/108 X |
| 3,474,457 | 10/1969 | Becker | 346/76 L |
| 3,493,754 | 2/1970 | Black | 350/397 X |
| 3,530,258 | 9/1970 | Gregg | 179/100.3 |
| 3,579,145 | 5/1971 | Lange | 332/7.51 |
| 3,625,617 | 12/1971 | Dichen | 250/225 X |
| 3,651,281 | 3/1972 | Becker | 360/59 |
| 3,651,504 | 3/1972 | Goldberg | 365/122 |
| 3,654,624 | 4/1972 | Becker | 346/76 L |
| 3,658,954 | 4/1972 | Broadbent | 264/1 |
| 3,662,158 | 5/1972 | Wong | 235/92 PC |
| 3,687,664 | 8/1972 | Broadbent | 96/35.1 |
| 3,696,344 | 10/1972 | Feinleib | 365/127 |
| 3,715,740 | 2/1973 | Schmit | 360/59 |
| 3,720,784 | 3/1973 | Maydan | 346/76 L X |
| 3,737,589 | 6/1973 | Redlich | 358/130 X |
| 3,924,062 | 12/1975 | Broadbent | 358/128.6 |
| 3,980,818 | 9/1976 | Browning | 365/215 X |

FOREIGN PATENT DOCUMENTS 1147531  4/1969  United Kingdom .............. 346/76 L

OTHER PUBLICATIONS

King, G. W., Recording Information by Laser, Discovery, V. 27, Jan. 1966, pp. 19–22.
Carlson et al., Some Considerations in the Design of a Thermal Microimage Recorder; Wescon Technical Papers, V72, 1968.
Rice et al; An Experimental Television & Playback System Using Photographic Discs; Journal of SMPTE, V79, N11, Nov. 1970, pp. 997–1002.
Kenville, R. F., Noise in Laser Recording, IEEE Spectrum, Mar. 1971, pp. 50–57.
Maydan, D., Micromachining & Image Recording on Thin Films by Laser Beams, Bell System Tech. Journal, V. 50, N6, Jul.–Aug. 1971, pp. 1761–1789.
Broadbent, K. D., A Review of the MCA Disco-Vision System, Journal of SMPTE, V. 83, Jul. 1974, pp. 554–559.

*Primary Examiner*—Joseph W. Hartary
*Attorney, Agent, or Firm*—Ronald J. Clark

[57] ABSTRACT

Apparatus and method for monitoring the optical recording of information on an information storage member using a first beam of light for writing the information and a second beam of light for reading the information. Both the writing beam and the reading beam are focused on the storage member by a single objective lens. The input information signal which is used for modulating the writing beam is also directed to a delaying circuit, and the delayed information signal is compared with the playback signal derived from the reading beam.

20 Claims, 13 Drawing Figures

FIG. 6 CROSSECTION OF MASTER VIDEO DISC.

METHOD AND APPARATUS FOR MONITORING THE STORAGE OF INFORMATION ON A STORAGE MEDIUM

This is a continuation of co-pending application Ser. No. 366,123 filed on Apr. 7, 1982 now abandoned, which is a continuation of application Ser. No. 106,023 filed Dec. 21, 1979 now abandoned which is a division of application Ser. No. 890,407, filed Mar. 27, 1978 and now U.S. Pat. No. 4,225,873, which is a continuation-in-part of application Ser. No. 714,133, filed Aug. 13, 1976 and now abandoned, which is a continuation of application Ser. No. 508,815, filed Sept. 24, 1974 and now abandoned, which is a continuation of application Ser. No. 333,560, filed Feb. 20, 1973 and now abandoned.

RELATED PATENT APPLICATIONS

Reference is to be had to the patent application entitled Mastering Machine by Richard L. Wilkinson, Ser. No. 890,771 filed Mar. 27, 1978, abandoned in favor of continuation application Ser. No. 94,108 filed Nov. 14, 1979.

BACKGROUND OF THE INVENTION

1. Field of the Invention

The present invention relates to the writing of a frequency modulated electrical signal upon an information bearing video disc surface in the form of successive light reflective and light non-reflective regions.

A reading apparatus is described using a reading light beam moving relative to the successive light reflective and light non-reflective regions to reconstruct the stored frequency modulated signal. The reconstructed frequency modulated signal is demodulated in a discriminator and changed to a form suitable for display on a T.V. monitor.

A novel information storage member is described for use in the writing and reading apparatus. This member includes successive light reflective and light non-reflective regions representing the frequency modulated signal.

Bias control circuitry for achieving duty cycle control in the writing apparatus and an improved form of a Pockels cell driving signal is also described.

DESCRIPTION OF THE PRIOR ART

U.S. Pat. No. 3,474,457 to C. H. Becker discloses an optical recording and reproducing apparatus using a highly focused coherent laser light beam to selectively burn away discrete, uniform portions of a film deposited on a carrier member. Information to be recorded is applied to a high frequency oscillator having a high frequency pulse repetition rate which is used to form holes in the carrier member. These holes are of substantially uniform and controlled dimensions of extremely diminutive sizes.

The present invention differs significantly from this technique. One of these differences includes changing the information signal to be recorded into a frequency modulated signal having a carrier frequency and frequency changes in time varying from the carrier frequency, and recording this frequency modulated signal upon an information carrier in the form of successive light reflective and light non-reflective regions of variable length to represent the instantaneous frequency of the frequency modulated signal.

U.S. Pat. No. 3,564,131 to E. D. Herold et al, and U.S. Pat. No. 3,720,784 to D. Mayden et al, disclose a system for producing an actual image comprising a multitude of small discrete holes formed by a laser in a radiation absorbing medium. These teach varying the spacing between the discrete holes and varying the size of the holes, respectively, to represent halftones in storing the actual image.

The present invention does not store an actual image. A typical signal source for use with the present invention is a television camera or a video tape recorder furnishing a recorded signal from a television camera. This signal is commonly called a video signal and it appears as a one volt peak to peak electrical signal in the form of a voltage varying with time format. This video signal is changed to a carrier frequency having frequency changes in time varying about the carrier frequency. This frequency modulated signal is stored on the information bearing surface of a video disc in the form of successive light reflective and light non-reflective regions of varying lengths to represent the instantaneous frequency of the frequency modulated signal.

An improved embodiment of Applicant's writing and reading apparatus and disc member are described in a publication entitled "A Review of the MCA Disco-Vision System" published in the July, 1974 *Journal of the SMPTE*, Volume 83.

SUMMARY OF THE INVENTION

The present invention relates to a video disc writing and reading apparatus and method, and further relates to a video signal storage member for use in the writing and reading apparatus.

The combination of the present invention includes a spindle which rotates the disc precisely in a circle and a lead screw mechanism for translating the head at a very constant velocity along a radius of the rotating disc. Obviously, it is desirable to synchronize or otherwise coordinate the disc drive with the translating drive to create a spiral track of predetermined pitch. In a preferred embodiment, the spacing between adjacent turns of the spiral is 2 $\mu$m, center to center. Assuming a spot diameter of the 1 $\mu$m, there will be a guard area of 1 $\mu$m between spots in adjacent tracks.

The "writing head" in the preferred embodiment is a microscope objective lens which flies at a constant height above the disc on an air bearing. The constant height is necessary because of the shallow focal depth of the objective lens A 40X dry microscope objective lens has been found to be satisfactory in terms of concentrating the energy of the laser beam at the disc surface to enable the writing of the 1 $\mu$m spot. A portion of the writing beam is sensed by a novel Pockels cell stabilizing circuit which tends to maintain the average power of the modulated beam at a predetermined level.

An Argon ion laser is used as the writing beam. A Pockels cell and Glan prism combination modulates the laser beam with the video information. In accordance with the present invention, a "read after write" capability is provided to monitor the writing operation. A second, Helium-Neon (He.Ne) or "reading" laser is provided which directs a lower power beam into the writing beam path, but at a slight angle with respect to the writing beam as it enters the writing head. The angle is chosen so that the reading beam illuminates an area on the track being written that is approximately 2 $\mu$m downstream from the writing spot.

The reading beam is reflected from the disc surface and returns through the writing head, retracing its optical path to a dichroic mirror which initially inserted the reading beam into the writing path. The reading beam is then directed to a beam splitter and through a bandpass filter which blocks any of the writing beam that may have followed the same path. The reading beam then impinges on a photodetector, which together with an FM discriminator generates the video information signal. The quality of this signal, when displayed on an oscilloscope or a TV monitor, indicates whether the values of the peak "cutting" power, average cutting power and focus are correct.

The "read and write" information can also be utilized in an error checking mode, especially if digital type information is being written. The input video information is delayed for an interval equivalent to the time displacement between the writing spot and the reading spot. The returned information is then compared with the delayed input information for "identity." The existence of too many dissimilarities would be a basis for either rechecking and realigning the apparatus or rejecting the disc.

The combination of the present invention includes a precision lathe which rotates the disc in a perfect circle and translates the recording "head" at constant velocity along a radius of a rotating disc. Obviously, it is desirable to synchronize or otherwise coordinate the two drives so that a spiral track of predetermined pitch can be created. If desired, concentric circles can also be created by alternately translating and writing. In a preferred embodiment employing a spiral, the spacing between adjacent turns of the spiral is 2 μm, center to center. Assuming a spot diameter of 1 μm, there will be a guard area of 1 μm between spots in adjacent tracks.

DESCRIPTION OF THE PREFERRED EMBODIMENT

Figure 1:
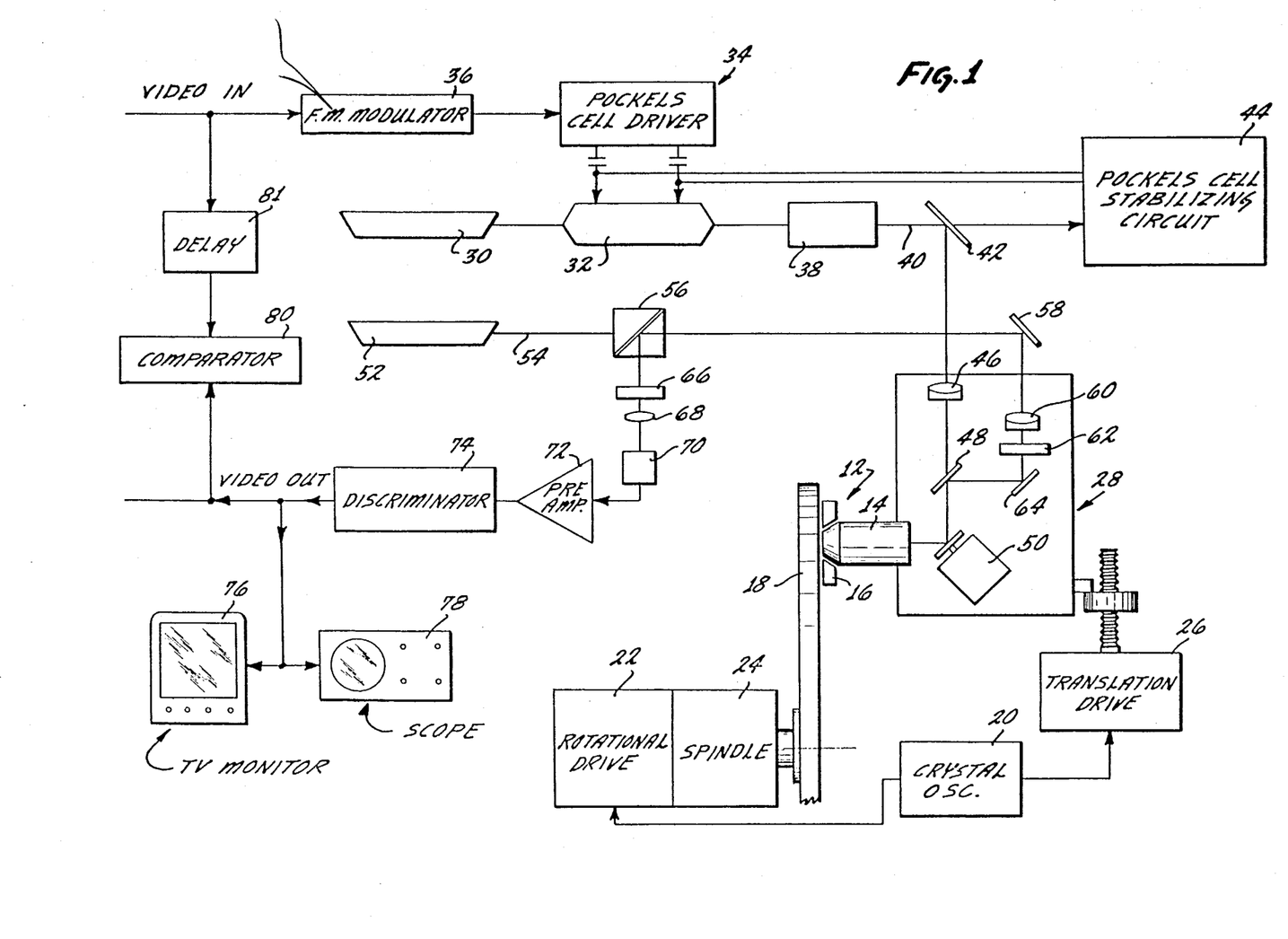
FIG. 1 is a generalized block diagram of a mastering machine in accordance with the present invention, for optically recording a frequency-modulated information signal on a storage member.

Turning first to FIG. 1, the writing apparatus 10 includes a writing head 12 which is, in the preferred embodiment, a dry microscope objective lens 14 mounted upon an air bearing support member 16. A 40X lens has been found to be satisfactory. A disc 18 is specially prepared and may be constructed according to the teachings of the prior art, in which a substrate has coated thereon a very thin film of a metal with a reasonably low melting point and a high surface tension.

A crystal oscillator 20 controls the drive elements. The disc 18 is rotated by a first, rotational drive element 22 which is coupled to a spindle 24. A second, translational drive element 26 controls the position of the writing head 12.

A translating carriage 28, which is driven by the translation drive element 26 through a lead screw and travelling nut, moves the writing head 12 in the radial direction relative to the rotating disc 18. The carriage 28 is provided with appropriate mirrors and lenses so that the remainder of the optics and electronics necessary to the writing device may be permanently mounted.

In the preferred embodiment of the present invention, the beam of a polarized cutting laser 30, which is an argon ion laser, is passed through a Pockels cell 32 which is driven by the Pockels cell driver 34. An F.M. modulator 36 receives the video signal that is to be recorded and applies the appropriate control signals to the Pockels cell driver 34. As described hereinafter, the video signal is of the type displayable on a T.V. monitor. Accordingly, it is a voltage varying with time signal. The F.M. modulator 36 is of standard design and converts the voltage varying with time signal to a frequency modulated signal having its informational content in the form of a carrier frequency having frequency changes with time corresponding to said voltage variations with time. As is known, the Pockels cell 32 responds to applied signal voltages by rotating the plane of polarization of the light beam. Since a linear polarizer transmits light only in a predetermined polarization plane, a polarizer, such as a Glan prism 38 in the preferred embodiment, is included in the writing beam path to provide a modulated writing beam 40. The modulated writing beam effectively follows the output of the F.M. modulator 36.

The modulated writing beam 40 emerging from the Pockels cell 32-Glan prism 38 combination is applied to a first mirror 42 which directs the writing beam 40 to the translating carriage 28. The first mirror 42 transmits a portion of the writing beam 40 to a Pockels cell stabilizing circuit 44 which responds to the average intensity of the writing beam to maintain the energy level of the beam.

A lens 46 is inserted in the path of the writing beam 40 to diverge the substantially parallel beam so that it will spread to fill the entrance aperture of the objective lens 14 for optimum resolution. A dichroic mirror 48 is included in the path oriented to substantially transmit all of the writing beam 40 to a second, articulated mirror 50. A mirror, such as has been shown in the patent applications of Elliott may be employed in the present invention. These applications include Ser. No. 299,893 filed Oct. 24, 1972. and entitled "Video Disc Player" now including the issuance of U.S. Pat. No. 3,829,622, and U.S. Pat. No. 3,944,727; and Ser. No. 314,082, filed Dec. 11, 1972 and entitled "Improved Video Disc Playback Assembly" now U.S. Pat. No. 3,914,541. The articulated mirror 50 then directs the beam through the lens 14 and is capable of shifting the point of impingement of the beam 40 on the surface of the disc 18.

A series of holes is formed in the metal coating. One hole is formed for each cycle of the F.M. modulated signal represented by the modulated writing beam 40. Since the modulated writing beam tracks the output of the F.M. modulator 36, the holes formed in the coating also track the output of the F.M. modulator. Obviously, since the informational content in the output signal of the F.M. modulator 36 is in the form of frequency changes in time about a carrier frequency, the "hole", "no hole" sequence changes to represent the stored video information by the holes being formed closer or farther apart and the size of the hole becomes larger or smaller as the writing beam 40 changes under the control of the F.M. modulated output signal from the F.M. modulator 36.

The objective lens 14 and the associated air bearing 16 effectively fly on a cushion of air at a substantially fixed distance from the surface of the disc 18. That distance is determined by the geometry of the bearing 16, the linear velocity of the disc 18, and the force used to load the head against the disc 18. The fixed spacing is required because the focal tolerance of a lens capable of resolving a 1 μm spot is also of the order of 1 μm.

A second, relatively low-power laser 52 provides a monitoring beam 54. In the preferred embodiment, the reading laser 52 is a helium-neon device which enables the reading beam 54 to be distinguished from the writing beam 40 by wavelength. A polarizing, beam splitter cube 56 transmits the reading beam 54 to a mirror 58 that directs the beam 54 through a second diverging lens 60 that spreads the reading beam 54 to fill the entrance aperture of the objective lens 14.

A quarterwave plate 62 is placed in the optical path and, in conjunction with the plane polarizing beam splitter 56, prevents light reflected from the disc 18 from re-entering the laser 52 and upsetting its mode of oscillation. The quarterwave plate 62 rotates the plane of polarization of the beam by 45 degrees on each pass so that the reflected beam is rotated 90 degrees with respect to the polarizing beam splitter 56 and is therefore not passed by it.

A second mirror 64 in the reading beam 54 path directs the beam into the dichroic mirror 48 and is capable of limited adjustment so that the paths of the writing and reading beams are substantially identical, except that the reading beam "spot" impinges on the disc 18 downstream from the writing beam spot as explained in greater detail below.

A filter 66 that is opaque to the argon ion beam is interposed in the path of light reflected from the beam splitter 56. The He.Ne reading beam 54 that is returned from the disc surface is able to pass through the filter 66 and through a lens 68 onto a photodetector 70. The reflected light of the reading beam impinges upon the photodetector 70. The photodetector 70 operates in its standard manner and generates an electrical current representative of the light impinging thereupon. In this case, the photodetector generates the signal represented by the "hole", "no hole" configuration formed in the coating. The "hole", "no hole" configuration is representative of the output of the F.M. modulator 36. The output of the F.M. modulator 36 is a carrier frequency having frequency changes with time representing the video signal to be recorded. The "hole", "no hole" configuration is representative of a carrier frequency having frequency changes with time representing the stored video signal. The output of the photodetector 70 is thus an electrical signal representing the stored carrier frequency having frequency changes with time representing the stored video signal.

The output of the photodetector 70 is applied to a preamplifier 72 which provides a signal of sufficient amplitude and signal strength for subsequent utilization. An F.M. discriminator 74 then provides a video output signal which can be utilized in several ways, two of which are shown, as examples only. The discriminator 74 is of standard design and function. It takes the frequency modulated signal from the photodetector 70 and changes it to a time dependent voltage signal having its informational content in the form of a voltage varying with time format suitable for display on the T.V. monitor 76.

In a first application, the video output is applied to a T.V. monitor 76 and an oscilloscope 78. As is well known, the T.V. monitor is responsive to a voltage varying with time signal. The information to be displayed on the T.V. monitor is represented by a voltage change with time. The T.V. monitor 76 shows the picture fidelity of the recording, and the oscilloscope 78 indicates the signal-to-noise ratio of the record and the quality of the cutting, whether it is light or heavy. Not shown, an appropriate feedback loop could be provided through the Pockels cell stabilizing circuit 44 to assure an adequate discrimination on the disc between a "hole" or "black" area and "no hole" or "white" area.

As an alternative utilization, the video output of the discriminator 74 is applied to a comparator 80. The other input of the comparator 80 is taken from the video input signal which is directed through a delay line 81. A delay that is equal to the accumulated delays of the writing system and the time elapsed between the instant of writing of the information and the time required for that incremental area of the disc to reach the reading point must be imparted to the input video signal.

Ideally, the video output signal of the discriminator 74 should be identical in all respects to the video input signal, after the proper delay. As previously mentioned, the output from the discriminator 74 is a voltage varying with time signal. The video in signal is also a voltage varying with time signal. Any differences noted represent errors which might be caused by imperfections in the disc's surface or malfunctions of the writing circuits. This application, while essential if recording digital information, is less critical when other information is recorded.

The output of the comparator circuit 80 can be quantized and counted, so that an acceptable number of errors can be established for any disc. When the errors counted exceed the standard, the writing operation can be terminated. If necessary, a new disc can be written. Any disc with excessive errors can then be reprocessed to serve as a "new" disc for a subsequent recording.

Well-known techniques are available to translate the write head assembly 12 in the radial direction with respect to the rotating disc 18. While in FIG. 1 the rotational and translational drives 22, 26 are indicated as independent, the drives are synchronized to enable the writing assembly 12 to translate a predetermined increment for each revolution of the disc 18, by means of the common crystal oscillator 20.

Figure 2:
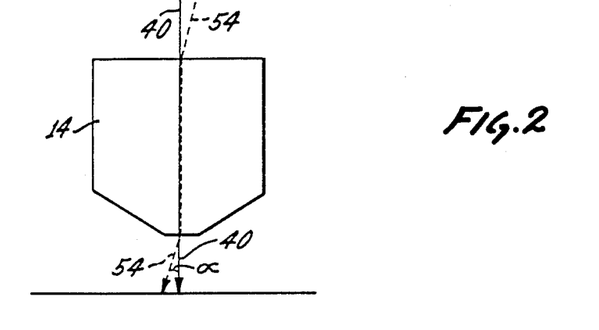
FIG. 2 is a schematic view of the optical path through the objective lens of FIG. 1.

Turning next to FIG. 2, there is shown in somewhat exaggerated form, the slightly differing optical paths of beam 40 from the writing laser 30 and the beam 54 the from reading laser 52. The writing beam 40 coincides with the optical axis of the microscope objective lens 14. The reading beam 54, in contrast, makes an angle $\alpha$ with the axis so that it falls some distance X, equal to $\alpha$ times the focal length of the objective, "downstream" from where the writing beam 40 is "cutting." The resulting delay between writing and reading allows the molten metal to solidify so that the recording is read in its final state. If it were read too soon while the metal was still molten, it would not provide pertinent information for adjusting the recording parameters.

Figure 3:
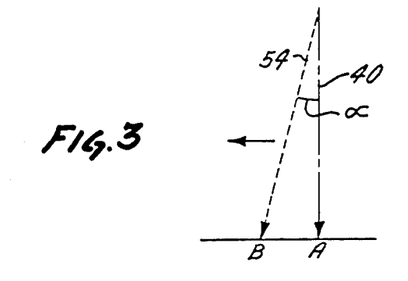
FIG. 3 is a schematic representation of the relative spacing between the points of impingement of the writing and reading beams.

This is best indicated in FIG. 3 where two points in the same information channel are shown as displaced. The point A, which is the point of impingement of the writing beam 40, is shown as being on the optical axis of the objective lens 14. Separated from point A, in the direction of medium motion, as indicated by the arrow, is the reading point B, which is at an angle $\alpha$ from the axis of the microscope objective lens 14. A distance between points A and B of two $\mu$m has provided a satisfactory monitoring of the writing operation.

Figure 4:
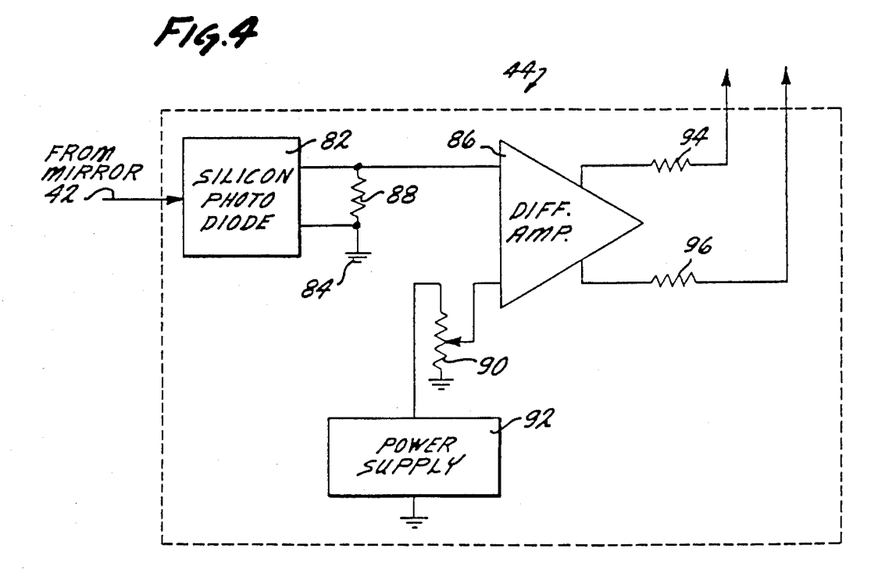
FIG. 4 is a schematic diagram of a Pockels cell stabilizing circuit used in the mastering machine of FIG. 1.

Turning finally to FIG. 4, there is shown an idealized diagram of a Pockels cell stabilizing circuit 44, suitable for use in the apparatus of FIG. 1. As is known, a Pockels cell rotates the plane of polarization of the applied light as a function of an applied voltage. Therefore, the Pockels cell is used to rotate plane polarized light, and the rotated light is passed through a plane polarizer, such as a Glan prism. The light issuing from the polarizer will be intensity modulated in accordance with the applied voltage.

Stated another way, the standard operating mode of a Pockels cell 32 and Glan prism 38 combination is for use as a light intensity modulating means. Each cycle from the FM modulator drives the Pockels cell through its rotational range of ninety degrees. Within this rotational range of ninety degrees, the Glan prism passes the maximum light applied at a point corresponding to a ninety degree rotation of the light by the Pockels cell. The Glan prism passes no light at a point corresponding to a zero rotation of the light by the Pockels cell. The Pockels cell only rotates the plane of polarization of the light applied therethrough. The Glan prism passes maximum light in one plane of polarization and minimum light in the plane dispaced ninety degres from that plane in which the maximum light passes.

Depending upon the individual Pockels cell, a voltage change of approximately 100 volts will cause the cell to rotate the plane of polarization through 90 degrees. However, the transfer characteristic of an individual cell may drift spontaneously, corresponding to a voltage change of ±50 volts, and accordingly, a feedback loop is desirable to maintain the cell within a useful, reasonably linear, operating range.

The stabilizing circuit 44 includes a photosensitive silicon diode 82, which is positioned to receive a portion of the writing beam 40 transmitted by the mirror 42 of FIG. 1. The silicon diode 82 functions in much the same fashion as a solar cell and is a source of electrical energy when illuminated by incident radiation. One terminal of the silicon diode 82 is connected to common reference potential 84, indicated by the conventional ground symbol and the other terminal is connected to one input of a differential amplifier 86. The silicon diode 82 is shunted by a load 88 which enables a linear response mode.

The other input to the differential amplifier 86 is connected through an appropriate potentiometer 90 to the common reference 84. A source of power 92 is coupled to the potentiometer 90, which enables the setting of the differential amplifier 86 to establish the average light level transmitted by the Pockels cell 32.

Accordingly, a pair of output terminals of the differential amplifier 86 are respectively connected through resistive elements 94, 96 to the input terminals of the Pockels cell 32 of FIG. 1. It is noted that the Pockels cell driver 34 is a.c. coupled to the Pockels cell 32, while the differential amplifier 86 is d.c. coupled to the Pockels cell 32.

In operation, the system is energized. The light from the writing beam 40 impinging on the silicon diode 82 generates a differential voltage at the input to the differential amplifier 86. Initially, the potentiometer 90 is adjusted to produce light at a predetermined average level of intensity. Thereafter, if the average level of intensity impinging on the silicon diode 82 either increases or decreases, a correcting voltage will be generated in the differential amplifier 86. The correcting voltage applied to the Pockels cell 32 is of a polarity and magnitude adequate to restore the average level of intensity to the predetermined level.

Thus, there has been shown an improved video disc recording assembly. A microscope objective lens 14 mounted on an air bearing "flies" at a predetermined distance from the surface of a metallized disc 18. The metallized coating is such that a laser beam 40 can, under suitable modulation, deliver sufficient energy to melt localized areas of the surface. Under surface tension, the molten metal retracts leaving a clear area of approximately one micron in width.

A second, low-energy laser 52 utilizing substantially the same optical path is directed through the same microscope objective lens 17 but is brought to the surface of the disc at a slight distance "downstream" from the point of writing. The reading beam 54 is returned through an appropriate optical system that excludes the reflected energy of the writing beam 40 and enables an analysis of the information that has been written on the disc 18.

The playback information can, among other things, control the intensity of the writing beam 40 to assure adequate "recording levels," and determine whether or not an unacceptable number of errors have been made in the recording process.

Metal film mastering starts with a fourteen inch diameter glass disc which is fine ground and optically polished to reduce the pit density to well under one pit per square millimeter. The disc is then washed, thoroughly rinsed in deionized water and spun dry. Then it receives a 200 to 300 Angstrom metal coating in a thermal evaporator and is ready for mastering.

For mastering, the disc is clamped to the spindle of the mastering machine and the cutting head is moved into position. An air bearing spindle is used. It is driven by a printed circuit type motor and is phase locked to the color subcarrier generated by the video information source circuit.

Cutting of the metal coating is accomplished with a microcope objective lens having 0.75 NA which focuses an argon-ion laser beam to produce a small spot of light on the disc surface. The spot selectively melts the metal film to encode the disc. The high NA of the lens required to produce the small (0.8 micron diameter) recording spot, makes the depth of the focus very shallow (plus or minus 0.3 micron) so that lens-to-metal film distance must be maintained constant to less than plus or minus 0.3 microns. This is accomplished by mounting the lens on a hydrostatic air bearing which rests on the disc surface. The bearing is loaded with enough force to make it follow disc wobbles as great as 25 microns.

The cutting head is driven radially by a lead screw which advances it 2.00 microns per turn of the spindle. Since the pitch uniformity of the finished recording depends on the steady advance of the head, care is taken to lap the lead screw, pre-load the nut which engages it and make the connection between the nut and the cutting head as stiff as possible. The cutting process consists of melting holes in metal film to store the frequency output signal from the FM modulator. The ends of the holes mark the zero crossings of the FM and so all of the FM information is contained on the disc.

Melting occurs when the power in the light spot exceeds a threshold characteristic of the composition and thickness of the metal film and the properties of the substrate. The spot power is modulated by a Pockels cell driven by the FM encoded video from the FM modulator. The on-off transitions are kept short to make the location of the hole ends precise in spite of variations in the melting threshhold. Such variations in the melting threshold can occur due to variations in the thickness of the metal coating and/or the use of a different material as the information storing layer.

The average power in the spot required to cut a metal layer having a thickness between 200 and 300 Angstroms is of the order of 200 milliwatts. Since the FM carrier frequency is about 8 MHz, $8 \times 10^6$ holes are cut per second and the energy per hole is $2.5 \times 10^{-9}$ joul. Because the metal solidifies rapidly after melting, it is possible to monitor the mastering process through the cutting objective lens by directing a low powered (1 milliwatt) reading beam through the objective at an angle to form a reading spot a few microns down stream from the cutting spot. The read spot is more strongly reflected by the metal than by the exposed glass so the reflected beam can be used to measure the recorded signal, noise, distortion and drop out frequency during cutting. This read while write feature is also used to check disc quality and machine adjustments.

Photoresist mastering is carried out in a manner very similar to metal film mastering with a difference that the disc is coated with a thin, uniform layer of positive photoresist instead of metal. The photoresist is exposed directly by the laser spot and development of the photoresist layer produces pits at the exposed site since positive photoresist is used. At this point, the developed disc is ready for galvanic processing as completely described in U.S. Pat. No. 4,211,617 to C. K. Hunyar, which is a continuation of application Ser. No. 552,249, filed Feb. 24, 1975 and now abandoned.

While photoresist mastering has the advantage of producing a member which is directly usable in the galvanic tooling process, the photoresist mastering process has a significant drawback in not being compatible with the read while write feature. Since the read while write feature is lost in photoresist mastering, the disc quality is unknown until the photoresist is developed and a metal film deposited upon it and the metal covered photoresist master is played back on a player and the quality monitored on a televsion monitor.

The ideal information track formed by this mastering process is a circular spiral of constant pitch which makes exactly one turn per television frame. The circularity of the tracks on a master disc is generally extremely good compared to the limits imposed by selectively keeping the radial acceleration below two gravities.

Time displacement error is largely dependent on the precision of the mastering spindle except for errors introduced by eccentricity and unroundness made in the replication process. The spindle in the mastering process is phase locked to the color subcarrier so that on the average the mastering spindle makes exactly one turn per television frame. Testing has shown that this procedure results in a spindle time error under 14 nanoseconds when sampled at 30 Hz.

Prior to giving the detailed mode of operation of the mastering machine, it would do well to establish a number of terms which have a special meaning in the description contained hereinafter. The laser intensity generated by the writing laser source as it impinges upon the master video disc is employed to interact with the information bearing portion of the video disc to form indicia representing the carrier frequency and the frequency variations in time from the carrier frequency.

The threshold power level required of the laser beam at the point of impact with the information bearing layer of the video disc differs depending upon the material from which the information bearing layer is made. In the two examples given hereinabove, bismuth and photoresist, the threshold power level required to form indicia differs significantly and represents a good example for illustrating the term threshold power. Obviously, the threshold power of other materials would also differ from each of the examples explained.

The indicia formed in a bismuth coated video disc master are alternate regions of light reflectivity and light non-reflectivity. The areas of light non-reflectivity are caused by the melting of the bismuth followed by the retracting of the bismuth before cooling to expose an underlying portion of the glass substrate. Light impinging upon the metal layer is highly reflected while light impinging upon the exposed portion of the glass substrate is absorbed and hence light non-reflectivity is achieved.

The threshold power is that power from the laser beam required to achieve melting and retracting of the metal layer in the presence of a laser beam of increasing light intensity. The threshold power level is also represented as that intensity of a decreasing light intensity signal when the metal layer ceases to melt and retract from the region having incident light impinging thereupon. More specifically, when the power in the impinging light beam exceeds the threshold power requirements of the recording material, a hole is formed in the recording material. When the light power intensity in the impinging light beam is below the threshold power level of the recording material, no hole is formed in the recording medium. The forming of a hole and the non-forming of a hole by the impinging light beam is the principal manner in which the light beam impinging upon a bismuth coated master interacts with the bismuth layer to form indicia on the recording surface. The indicia represents a carrier frequency having frequency changes in time varying about the carrier frequency.

A video disc master having a thin layer of photoresist formed thereover has its own threshold power level. The mechanism whereby a light beam exposes a photoresist layer is pursuant to a photon theory requiring a sufficient number of photons in the impinging light beam to expose a portion of the photoresist. When the positive going modulated light beam contains sufficient photons above this threshold power level, the photoresist in that area is exposed so that subsequent development removes the exposed photoresist. When the photon level in a decreasing light intensity modulated light beam falls below the normal threshold power level of the photoresist, the photoresist ceases to be exposed to the extent that subsequent development does not remove the photoresist illuminated by an impinging light beam having photons below the threshold power level.

The impinging light beam from the modulated laser source interacts with the information bearing layer to fully expose or under expose the photoresist layer illuminated by the impinging light beam. This is an interaction of the photons in the impinging light beam with the information bearing member to form indicia of the carrier frequency having frequency changes in time varying about the carrier frequency. The indicia storing the carrier frequency and frequency change in time are more fully appreciated after the development step whereby those portions of fully exposed photoresist material are effectively removed leaving the under exposed portions on the video disc member.

Figures 5, 6:
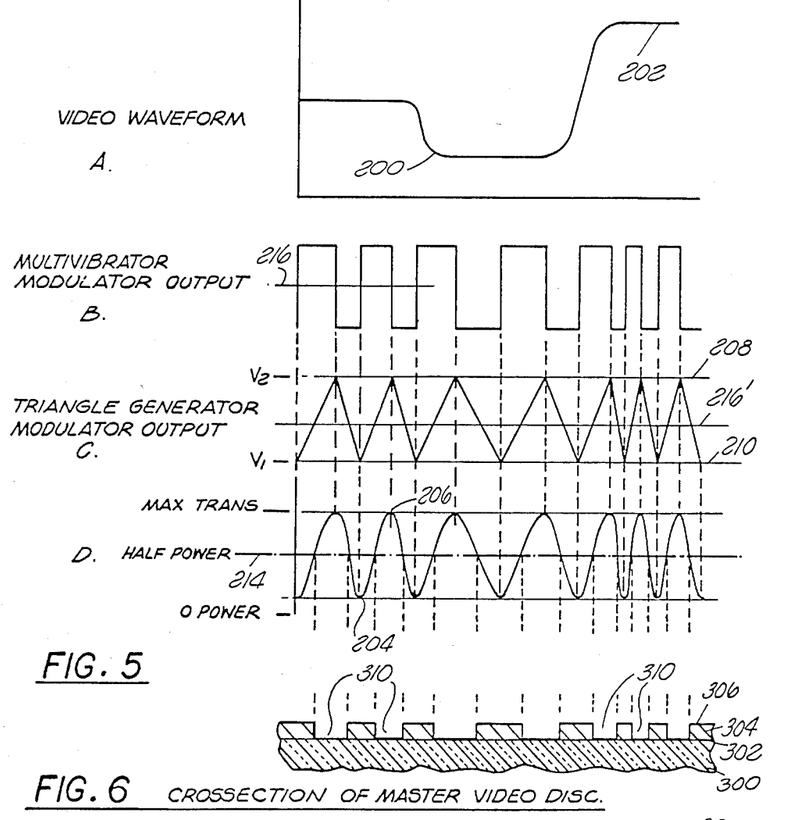
FIG. 5 shows various waveforms present in the mastering machine of FIG. 1.
FIG. 6 is a schematic cross-sectional view of a metallic film-coated video disc used with the mastering machine of FIG. 1.

Referring to line A of FIG. 5, there is shown an idealized or simplified video waveform that is typically supplied as a video signal from a video tape recorder or television camera. This video signal is then applied to an FM modulator circuit 36. Two output signals are shown on lines B and C, and each is an FM modulated output signal and each carries the same frequency information. The waveform on line B shows the output normally generated by a multi-vibrator type FM modulator 36. The waveform shown on line C shows the output generated by an FM modulator 36 having a triangular shaped output waveform. Both waveforms contain the same frequency information. The triangular shaped waveform gives enhanced results when used in driving a Pockels cell 32 for light modulation of a constant intensity light beam applied through the Pockels cell.

A device for producing a suitable triangular waveshape signal is manufactured by Wavetek, Inc. of San Diego, CA., Model 164.

The frequencies contained in each waveform B and C are at all times identical and each represents the voltage level of the video waveform shown in line A. By inspection, it can be seen that the lower amplitude region of the video waveform generally indicated by the numeral 200 corresponds to the low carrier frequencies and higher amplitude regions of the video waveform as generally indicated at 202 corresponds to the higher frequency shown in lines B and C. It is the custom and practice of the television industry to utilize a one volt peak to peak voltage signal having voltage variations in time as the video signal generated by a television camera. These signal characteristics are the same required to drive a television monitor 76. The advantage of using a triangular shaped waveform for driving a Pockels cell 32 is to match the Pockels cell's transfer characteristic with a selected waveform of the modulating signal to achieve a sinusoidal modulation of the light beam passing through the Pockels cell and to the Glan prism 38. The triangular waveform shown in line C is a linear voltage change with time. The linear voltage change versus time of the triangular driving waveform when multiplied by a sinusoidal voltage change versus light transfer function of the Pockels cell 32 gives a sinusoidally varying light intensity output from the Glan prism.

The waveform shown on line D illustrates the sinusoidal waveform which corresponds to the light intensity output from the Glan prism 38 when the Pockels cell 32 is driven by the triangular waveform shown on line C.

Referring specifically to the bottommost point at 204 and the topmost point at 206 of the waveform shown on line D, the point exactly equally distant from each is identified as the half power point. An understanding of the utilization of this half power point feature is required for high quality mastering operations.

The peak to peak voltage of the triangular waveform is represented by a first maximum voltage level $V_2$ shown at bint 208 on line C and by a second minimum voltage level $V_1$ on line 210. The voltage differential between points 208 and 210 is the driving voltage for the Pockels cell 32. This voltage differential is adjusted to equal that voltage required by the Pockels cell 32 to give a ninety degree rotation of the output polarization of the light passing through the Pockels cell 32. The bias on the Pockels cell is maintained such that voltage levels $V_1$ and $V_2$ always correspond to the zero degree rotation and the ninety degree rotation respectively of the light beam passing through the Pockels cell 32. The forty-five degree rotation of a light beam is half way between the two extremes of a triangle waveform. That half way voltage is always the same for the Pockels cell 32. But the half way voltage with respect to zero volts may drift due to thermal instabilities causing the half power voltage point to drift also. The correct biasing of the halfway voltage is completely described hereinafter with reference to FIGS. 9, 10, 11.

While the waveform shown on line C of FIG. 5 shows the triangular wave shape generated by the FM modulator 36, it also represents the wave shape of the signal generated by the Pockels cell driver 34. The output from the FM modulator is typically in a smaller voltage range, typically under 10 volts while the output from the Pockels cell driver typically swings 100 volts in order to provide suitable driving voltage to the Pockels cell to drive it from its zero rotational state to its ninety degree rotational state. In discussing the voltage levels $V_1$ and $V_2$ and the lines 210 and 208, respectively, representing such voltage points, reference is made to line C of FIG. 5 because the output from the Pockels cell driver has the identical shape while differing in the amplitude of the waveform. This was done for convenience and the elimination of a substantially identical wavefrom different only in amplitude.

Referring to FIG. 6, there is shown a cross sectional, schematic view of a video disc formed according to the mastering process of the invention described herein. A substrate member is shown at 300 having a planar upper surface indicated at 302. An information bearing layer 304 is formed to top the upper surface 302 of the substrate 300. The information bearing layer 304 is of uniform thickness over the entire surface 302 of the substrate 300. The information layer 304 itself has a planar shaped upper surface 306.

FIG. 6 is shown positioned beneath Line C of FIG. 5 showing the intensity of the light beam passing from the Pockels cell 32-Glan prism 38 combination in the improved embodiment which utilizes a voltage controlled oscillator in the F.M. modulator 36 for generating a triangular shaped output waveform as the driving waveform shape to the Pockels cell. As previously described, the threshold power level of the information bearing layer is defined as that power required to form indicia in the information bearing layer in response to the impinging light beam. For a metal surface, the thermal threshold point is that power required to melt the metal layer and have the metal layer retract from the heated region of impingement. For a photoresist layer, the threshold power level is that power level required to supply sufficient photons to completely expose the photo-resist informatioon bearing layer. In the case of the metal layer, the heated metal retracts from the impinging area to expose the substrate 300 disposed thereunder. In the case of the photoresist material, the photon power is sufficient to fully expose the total thickness of the photoresist layer 324 completely down to the upper surface 322 of the substrate 320 as described with reference to FIG. 7.

It has been previously discussed how the half power point of the Pockels cell 32-Glan prism 38 combination is located at a point halfway between a first operating point at which maximum transmission from a fixed intensity beam passes through the Glan prism and a second operating point at which minimum transmission from a fixed intensity beam passes through the Glan prism. The half power point is the point at which the light passing through the Pockels cell has been rotated forty-five degrees from the point of zero power transmission.

In operation, the output power from the laser 30 is adjusted such that the half power point of the Pockels cell 32-Glan prism 38 combination provides sufficient energy to equal the threshold power level of the information bearing member employed, such as the member 304. The matching of the half power point of the Pockels cell-Glan prism combination ensures highest recording fidelity of the video frequency signal to be recorded and ensures minimum intermodulation distortion of the signal played back from the video disc recording member.

This matching of the power levels is illustrated with reference to line D of FIG. 5 and FIG. 6 and by the construction lines drawn vertically between the half power point represented by the line 214 shown on line D of FIG. 5 and the apertures shown generally at 310 in FIG. 6. The length of an aperture 310 is coextensive with the time that the transmitted intensity of the modulated light beam exceeds the half power point line 214 shown with reference to line D of FIG. 5.

In this embodiment, the half power point line 214 also represents the zero crossing of the triangular wave shape shown on line C of FIG. 5. The zero crossing points are represented by a lines 216 and 216' shown in FIGS. 5B and 5C, and the importance of regulating the half power point is explained in greater detail with reference to FIGS. 11 and 12.

Figure 7:
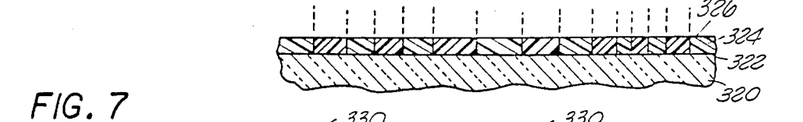
FIG. 7 is a schematic, cross-sectional view of a photoresist-coated video disc used with the mastering machine of FIG. 1.

FIG. 7 shows an information storage member including a substrate 320 having a planar upper surface 322. A thin layer of photoresist 324 of uniform thickness is formed over the planar upper surface 322 of the substrate 320. The thin photoresist layer 324 is also formed with a planar upper surface 326. The photoresist layer 324 is a light responsive layer just as the metal bismuth layer 304 is a light responsive layer. Both the thin opaque metallized coating 304 and the photoresist layer 324 function to retain indicia representative of the video input signal. In the case of the metal layer 304, apertures 310 are formed in the metallized layer to form successive light reflective and light non-reflective regions in the information storage member.

Figure 8:
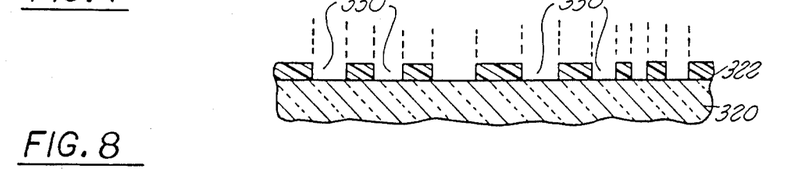
FIG. 8 is a schematic, cross-sectional view of the photoresist-coated video disc of FIG. 7, after exposed portions of it have been removed.

Referring to FIG. 8 showing the photoresist coated information storage member, regions 330 are formed in substantially the same manner as regions 310 were formed with reference to the structure shown in FIG. 6. Rather than apertures 310 being formed as shown with reference to FIG. 6, exposed regions 330 are formed corresponding to the apertures 310. The exposed photoresist material is represented in FIG. 7 by cross hatching of the regions in the photoresist information storage layer 324. Subsequent development of the exposed photoresist material removes such exposed photoresist material leaving apertures comparable to the apertures 310 shown with reference to FIG. 6.

In operation, when using the photoresist coated substrate video disc member, the output power of the writing laser is adjusted such that the power of the modulated laser beam 40 passing through the Pockels cell 32-Glan prism 38 combination at the half power point of the Glan prism equals the photon threshold power required to completely expose the photoresist illuminated by the impinging light beam. Just as with the bismuth coated master video disc system, this ensures highest fidelity recording and minimum intermodulation distortion during the playback of the recorded video signal.

In referring to both FIGS. 6 and 7, that portion of the light beam passing through the Glan prism 38 above the half power point of the Glan prism as represented by that portion of the waveform shown on line D of FIG. 5 which is above the line 214, causes an irreversible change in the characteristics of the light sensitive surface 304 in the case of the bismuth coated video disc shown in FIG. 6 and the photoresist coating 324 shown with reference to the photoresist coated video disc shown in FIG. 7. In the case of the bismuth coated video disc member 300, the irreversible changes take the form of successively formed apertures 310 in the opaque metallized coating 304. In the case of the photoresist coated substrate 320, the irreversible alteration of the characteristic of the photoresist layer 324 occurs in the form of successive fully exposed regions 332.

While bismuth is listed as the preferred metal layer, other metals can be used such as tellurium, inconel and nickel.

Figure 9:
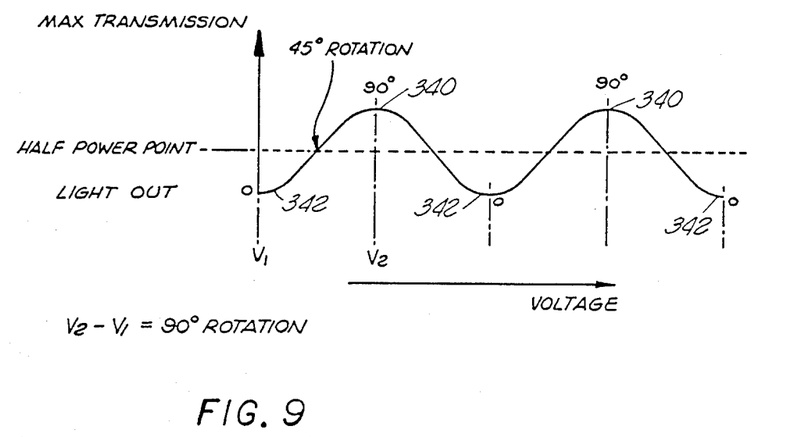
FIG. 9 is a graph of the transfer characteristic of the Pockels cell and Glan prism combination of the mastering machine of FIG. 1.

Referring to FIG. 9, there is shown the transfer characteristic of the Pockels cell 32 versus linear voltage change of input drive to the Pockels cell as a sinusoidal voltage change versus rotation in degrees of the light passing through the Pockels cell 32. The ninety degree rotation point is shown at point 340 and equals the maximum light transmission through the Glan Prism. The zero degree rotation point is shown at points 342 and equals the zero or minimum light transmission through the Glan prism. The zero light transmission point 342 corresponds to the voltage level $V_1$ represented by the line 210 in line C of FIG. 5. The ninety degree rotation point corresponds with the voltage level $V_2$ represented by the line 208 on line C of FIG. 5. The point half way between these two voltages represented by the line 216' is equal to $V_2$ minus $V_1/2$ and corresponds to a forty-five degree rotation of the light beam passing through the Pockels cell.

As is well known, the power through the Pockels cell is substantially unchanged. The only characteristics being changed in the Pockels cell 32 is the degree of rotation of the light passing therethrough. In normal practice, a Pockels cell and Glan prism 38 are used together to achieve light modulation. In order to do this, the principal axis of the Pockels cell and the Glan prism are put into alignment such that a light beam polarized at ninety degrees rotation passes substantially undiminished through the Glan prism. When the same highly polarized light is rotated by the Pockels cell for ninety degrees rotation back to the zero degree rotation, the light beam does not pass through the Glan prism. In actual practice, the full transmission state and zero transmission state is not reached at high frequencies of operations.

Figure 10:
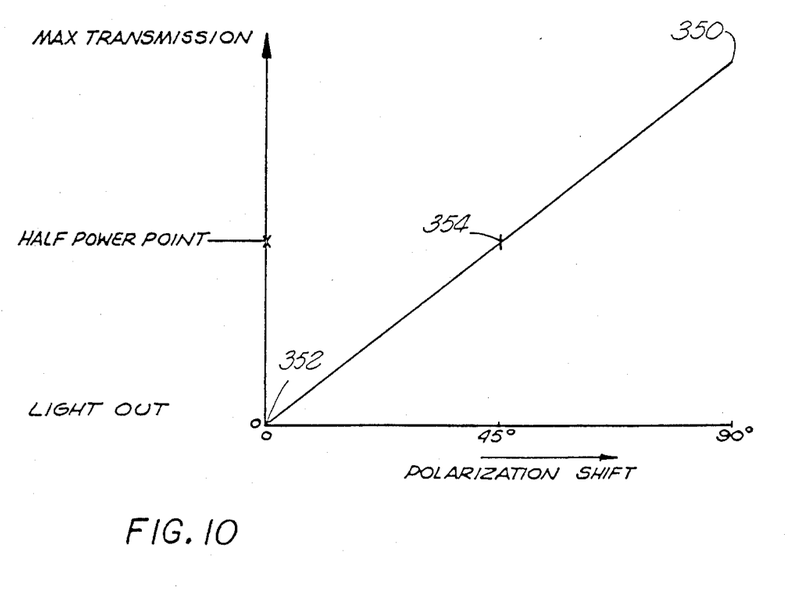
FIG. 10 is a graph of the transfer characteristic of the Glan prism of the mastering machine of FIG. 1.

Referring to FIG. 10, there is shown the transfer characteristic of a Glan prism. At point 350, maximum transmission through the Glan prism 38 is achieved with a ninety degree rotation of the incoming light beam. At point 352, minimum or zero light transmission through the Glan prism is achieved at zero rotation of the incoming light beam. Half of the intensity of the impinging light beam is passed through the Glan prism as indicated at points 354 which corresponds to forty-five degrees rotation of the light entering the Glan prism. Obviously, the absolute power of the light passing through the Glan prism at the forty-five degree rotation can be adjusted by adjusting the light output intensity of the light source. In this embodiment, the light source is the writing laser 30.

In the preferred embodiment, the power output from the writing laser 30 is adjusted such that the intensity of the light passing through the Glan prism 38 at its half power point coincides with the threshold power level of the recording medium. Since more power is required to melt a bismuth layer than is required to fully expose a photoresist layer, the absolute intensity of a writing beam used in writing on a bismuth master disc is greater than the intensity of a writing laser used to interact with a photoresist covered master video disc.

Figure 11:
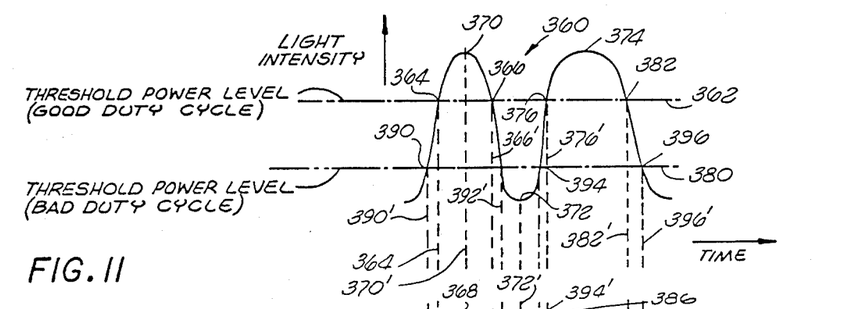
FIG. 11 is a graph of a typical light intensity waveform present in the mastering machine of FIG. 1.
Figure 12:
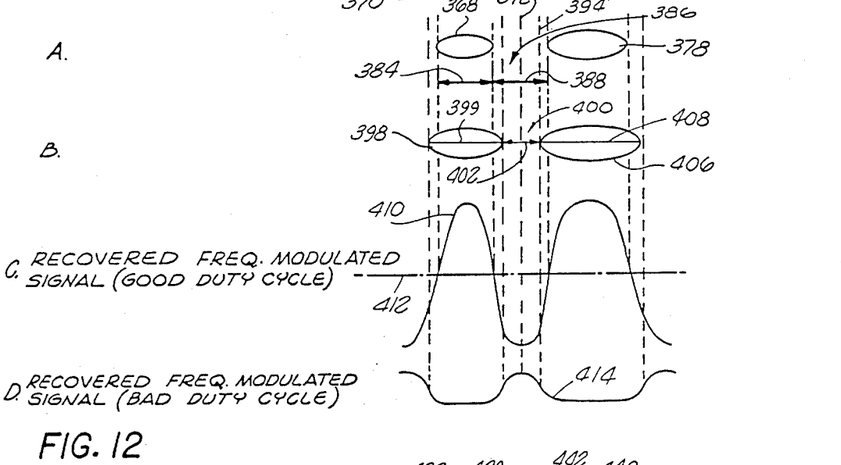
FIG. 12, in conjunction with FIG. 11, shows a series of waveforms useful in explaining the relationship between the intensity of the writing beam and the duty cycle of recording.

Referred collectively to FIGS. 11 and 12, there is shown a series of waveforms useful in explaining the relationship between length of a hole cut in a master viode disc by the writing laser 30 and the length of uncut land area between successively formed holes. This relationship has been referred to hereinbefore as a relationship formed by the value of the peak cutting power, the average cutting power and focus of the spot on the metal layer. Collectively, these terms have evolved into a single term known as duty cycle which term represents all three such characteristics.

As previously described, the energy required to interact with the information bearing layer on video disc substrate is that energy necessary to cause irreversible changes in the material selected for placement on the master video disc member. In the case of a bismuth coated master, the energy required is that needed to selectively remove the portion of the bismuth coated layer in those locations when the energy is above the threshold energy level of the bismuth layer. If this energy contained in the focused spot of light is not focused properly upon the bismuth layer, then the energy cannot be used for its intended function and it will be dissipated without effecting its intended function. If some cutting occurs, distortions are introduced into the mastering process. If the peak cutting power greatly exceeds the threshold power level of the recording medium, destructive removal of material occurs and provides a surface containing distortion products caused by this destructive removal. The average cutting power is that power at a point midway between a first higher cutting power and a second lower cutting power. As just described, the average cutting power is preferably fixed to equal the threshold power level of the recording medium. In this sense, the intensity of the light beam above the average cutting power interacts with the information bearing layer to form indicia of the signal to be recorded. The intensity of the light beam below the average cutting power fails to heat a bismuth coated master to a point needed in the hole forming process or fails to fully expose a portion of a photoresist coated master.

Referring briefly to lines B and C of FIG. 5, the adjustment of the average cutting power to coincide with the line 216 shown in line B and with the line 216' shown with reference to the line C of FIG. 5, results in a duty cycle where the length of a hole equals the length of the "land" area positioned successively thereafter. This is known as a 50% or fifty-fifty duty cycle. A fifty-fifty duty cycle is the preferable duty cycle in a recording procedure but commercially acceptable playback signals can be achieved in the range from sixty-forty to forty-sixty. This means that either the hole or the intervening land member becomes larger while the other member becomes smaller.

Referring to FIG. 11, there is shown a waveform represented by a line 360 corresponding to two cycles of the light intensity transmitted through the Pockels cell-Glan prism combination and represented more specifically on line D of FIG. 5. The threshold power level of the recording medium is represented by a line 362. The threshold power level of the reading medium is caused to be equal to the half power point of the light intensity transmitted by the Pockels cell-Glan prism combination by adjusting the absolute intensity of the writing laser 30.

When the threshold level is properly adjusted at the half power point, an indicia is formed on the information surface layer of the master video disc beginning at point 364 and continuing for the time until the intensity falls to a point 366. Dash lines shown at 364' and 366' are drawn to line A of FIG. 12 showing an indicia represented by the circle ellipse 368, which has been formed for the period of time when the light intensity continues to rise pass the point 364 to a maximum at 370 and then falls to a point 366. The light intensity below point 366 falls to a minimum at 372 and continues to rise towards a new maximum at 374. At a certain point between the lower intensity level 372 and the upper intensity level 374, the light intensity equals the threshold power level of the recording medium at 376. Beginning at point 376, the energy in the light beam begins to form an indicia represented by the ellipse 378 shown on line A of FIG. 11. A dotted line 376' shows the start of formation of indicia 378 at the point when the light intensity exceeds the threshold level 362. The indicia 378 continues to be formed while the light intensity reaches a maximum at 374 and begins to fall to a new minimum at 375. However, at the intersection of line 360 with the threshold power level at 362 the light intensity falls below the threshold power level and the indicia is no longer formed. In the preferred embodiment, the length of the indicia represented by a line 384 equals the length of the land region shown generally at 386 as represented by the length of the line 388. Accordingly, the matching of the half power point light intensity output from the Pockels cell 32-Glan prism 38 combination with the threshold power level of the recording surface results in a fifty-fifty duty cycle wherein the length of the indicia 368 equals the length of the next succeeding land region 386. Points 364, 366, 376 and 382 shown on the line 360 represent the zero crossing of the original frequency modulated video signal. Hence, it can be seen how the indicia 368 and 386 represent the frequency modulated video signal. This representation in the preferred embodiment represents a fifty-fifty duty cycle and is achieved by adjusting the half power level of the beam 40 exiting from the Pockels cell-Glan prism combination to equal the threshold power level of the recording medium. The waveform shown with reference to FIG. 11, including the variable light intensity represented by the line 360, represents a preferred mode of operation to achieve 50/50 duty cycle independent of the recording medium employed on the master video disc member. The absolute intensities at the various points change according to the absolute intensities required for the modulated light beam to interact with the recording surface, but the relative wave shapes and their relative locations remain the same. More specifically, the absolute intensity of the threshold power level for bismuth is different than the absolute intensity of the threshold power level for photoresist, but the relationship with the intensity line 360 is the same.

Referring to the combination of FIG. 11 and line B of FIG. 12, there will be described the results of failing to match the half power point output of the Pockels cell-Glan Prism combination with the threshold power level of the recording medium. Referring to FIG. 11, a second dash line 380 represents the relationship between the actual threshold power level of the recording medium being used with the light intensity output from the Pockels cell 32 Glan Prism 38 combination. The threshold power level line 380 intersects the intensity line 360 at a plurality of locations 390, 392, 394 and 396. A line 390' represents the intersection of the light intensity line 360 with the threshold power level 380 and signals the start of the formation of an indicia 398 shown on line B of FIG. 12. The indicia 398 is formed during the time that the light intensity is above the threshold power level. The length of the indicia 398 is represented by the time required for the light intensity to move to its maximum at 370 and fall to the threshold point 392 as is shown by a line 399. The length of a land area indicated generally at 400 has a length represented by a line 402. The length of a line 402 is determined by the time required for the light intensity to move from threshold point 392 to the next threshold point 394. During this time, the intensity of the light beam is sufficiently low as to cause no interaction with the recording medium. A second indicia is shown at 406 and its length corresponds with the point at which the intensity of the waveform represented by the line 360 exceeds the threshold power level at point 394. The length of the indicia 406 is shown by a line 408 and is determined by the time required for the light intensity to rise to a maximum at 374 and fall to the threshold level at point 396.

Various lines are shown indicating the beginning and ending of the indicia and intravening land areas by employing the number raise to the prime used to identify the intersection of the light intensity line 360 with the threshold power level lines 362 and 380.

The successively positioned indicia 398 and land region 400 represent a single cycle of the recorded frequency modulated video signal. The indicia 398 represents approximately 65 percent of the sum of the length of the line 399 and the line 402. This represents a duty cycle of 65/35 percent. Sixty-five percent of the available space is an indicia while thirty-five percent of the available space is land area. Typically, the indicia in the final format is a light scattering member such as a bump or hole, and the land area is a planar surface covered with a highly reflective material.

The frequency modulated video information represented by the sequentially positioned light non-reflective member 368 and light reflective member 386 shown in line A (FIG. 12) represents the preferred duty cycle 50/50. When the photoresist mastering procedure is employed, the reflectivity of the upper surface of the photoresist layer is not significantly altered by the impingement of the writing beam such as to be able to detect a difference between light beams reflected by the exposed developed and non exposed portions of the photoresist member. It is because of this effect that a read after write procedure, using a photoresist coated master video disc is not possible.

Referring to line C of FIG. 12, there is shown a representation of the recovered video signal represented by the sequence of indicia 368 and land area 386 shown on line A. The waveform shown in line C is an undistorted sine wave 410 and contains the same undistorted frequency modulated information as represented by the light intensity waveform represented by the line 360 shown in FIG. 11. The sine wave shown in line C of FIG. 12 has a center line represented by a line 412 which intersects the sine wave 410 in the same points of intersection as the line 362 intersects the intensity line 360 shown in FIG. 11.

Referring to line D of FIG. 12, there is shown a recovered frequency modulated video signal having bad second harmonic distortion. The fundamental frequency of the waveform represented by a line 414 shown in line D is the same as that contained in the waveform shown one line C. However, the information shown in line D contains bad second harmonic distortion. When used in a system in which bad second harmonic distortion is not a disabling problem, the attention to a 50/50 duty cycle situation explained hereinabove need not be strictly followed. However, when it is necessary to have a substantially undistorted output signal recovered from the video disc surface, it is necessary to follow the procedure discribed hereinabove.

Figure 13:
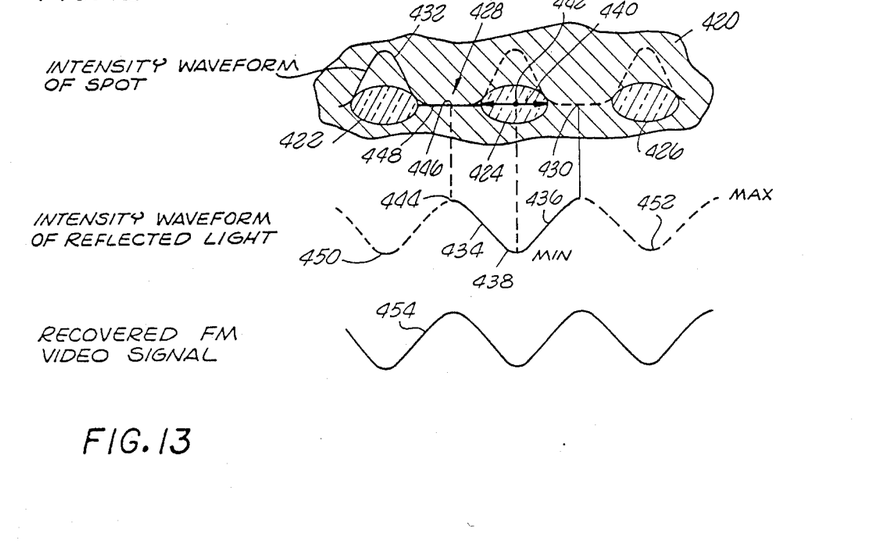
FIG. 13 shows additional waveforms useful in illustrating the operation of the mastering machine of FIG. 1.

Referring to FIG. 13, there is shown the relationship between the intensity of the reading spot in the reading beam as it impinges upon successively positioned light reflective and light non-reflective regions formed during a preferred form of the mastering process. In a preferred embodiment, a metal is used for this purpose and the preferred metal as disclosed is bismuth.

Line A of FIG. 13 shows a plurality of indicia formed in the surface of a video disc master. In the preferred embodiment the holes formed in a bismuth layer 420 are shown at 422, 424 and 426. The intervening portions of the layer 420 which are unaffected by the formation of the holes 422, 424 and 426 are sometimes called "land" areas and are indicated generally at 428 and 430. The land areas are highly reflective. The formation of the holes 422, 424 and 426 expose the underlying glass substrate which is essentially light absorbing and hence the glass substrate is a light non-reflective region. The waveform shown at 432 represents the light intensity waveform of the spot in the read beam as the spot passes over a light non-reflective region. This indicates the spacial relationship between the spot as it moves over a light non-reflective region.

Referring to line B of FIG. 13, there is shown a waveform represented by a line 434 indicating the intensity waveform of the reflected light as a spot having the intensity relationship shown in FIG. A passes over a successively positioned light reflective and light non-reflective region. A solid line portion 436 of the line 434 shows the intensity waveform of the reflected light as the spot passes over the light non-reflective region 424. The intensity of the reflected light shows a minimum at point 438 which corresponds with the center of the non-reflective region 424. The center of the non-reflective portion 424 is shown on a line 440 at a point 442. The intensity waveform of the reflected light is a maximum, as shown at 444, when corresponding to a center point 446 of the land area 428 positioned between successive non-reflective regions 422 and 424 respectively. The center point 446 is shown on a line 448 representing the center line of the information track. The dotted portion of the line 434 represents the past history of the intensity waveform of the reflected light when the light passed over the non-reflective region 422. A dotted portion 452 of the waveform 434 shows the expected intensity of the reflected light beam when the reading spot passes over the non-reflective region 426.

Referring to line C of FIG. 13, there is shown the recovered electrical representation of the light intensity signal shown on line B. The electrical representation is shown as a line 454 and is generated in the photodetector 70 shown in FIG. 1.

A special advantage of the read while write capability of the mastering procedure herein described includes the use of the instantaneous monitoring of the information just written as a means for controlling the duty cycle of the reflective and non-reflective regions. By displaying the recovered frequency modulated video signal on a television monitor during the writing procedure, the duty cycle can be monitored. Any indication of the distortion visible on the monitor indicates that a change in duty cycle has occurred. Means are provided for adjusting the duty cycle of the written information to eliminate the distortion by adjusting the duty cycle to its 50/50 preferred operating point. A change in duty cycle is typically corrected by adjusting the absolute intensity of the light beam generated in the laser 30 in a system having either an average intensity biasing servo or a second harmonic biasing servo and in conjunction with circuitry for adjusting the half power point output of the Pockels Cell-Glan Prism combination to equal the threshold power level of the recording medium. The term half power point and average intensity are interchanged in the portions of the specifications and claims which concern the use of the triangular shaped wave form generated by the FM modulator. The modulated light beam 40 exiting from the Glan Prism 38 is of sinusoidal shape. In this situation the half power point equals the average intensity and this would be the case for any symmetrical wave form. A frequency modulated output from an FM modulator has been found to act as such a symmetrical wave form.

While the invention has been particularly shown and described with reference to a preferred embodiment and alterations thereto, it would be understood by those skilled in the art that various changes in form and detail may be made therein without departing from the spirit and scope of the invention.

What is claimed is:

1. Apparatus for monitoring the recording of information on an information storage member, comprising:
    means for providing a writing beam of light;
    means for modulating the intensity of the writing beam of light in accordance with an input information signal to be recorded;
    means for moving the information storage member in a prescribed fashion;
    optical means including an objective lens for focusing the writing beam of light onto the information storage member, to record the information signal in a recording track therein;
    means for providing a reading beam of light;
    the objective lens of said optical means further operating to focus simultaneously the reading beam of light onto the recording track of the information storage member, the point of impingement of the reading beam trailing that of the writing beam by a prescribed distance, the reading beam being reflected by the recording track to produce a reflected beam of light that is modulated in intensity in accordance with the recorded information signal;
    means for monitoring the reflected beam of light and for producing a playback signal corresponding to its modulated intensity;
    means for delaying the input information signal; and
    means for comparing the playback signal with the delayed information signal.

2. Apparatus as defined in claim 1, wherein:
    the information storage member is disc shaped; and
    said means for moving includes
    means for rotating the disc-shaped storage member at a prescribed rate, and
    translational drive means, synchronized with said means for rotating, for moving the objective lens of said optical means radially relative to the disc-shaped storage member.

3. Apparatus as defined in claim 1, and wherein said means for delaying the input information signal delays the signal by a time duration equal to the delay occurring while the apparatus records and plays back the signal and the delay occurring during movement of the information storage member by an amount corresponding to the distance between the respective points of impingement of the writing beam and reading beam.

4. Apparatus as defined in claim 1, wherein said optical means further includes dichroic mirror means for combining the writing and reading beams of light and directing the two beams along substantially identical optical paths to impinge on the information storage member, said dichroic mirror means further directing the reflected beam of light along an optical path to impinge on said means for monitoring.

5. Apparatus as defined in claim 4, wherein said optical means further includes means for adjusting the relative optical paths of the writing beams and the reading beam such that the point of impingement of the reading beam on the information storage member is the prescribed distance away from the point of impingement of the writing beam on the member.

6. The apparatus as claimed in claim 1, wherein:
    said means for comparing produces a quantized output signal representative of the difference between the playback signal and the input information signal; and said apparatus further includes means for counting said quantized output signal to produce an error count signal.

7. The apparatus as claimed in claim 6, further including means for comparing the error count signal to a prescribed standard.

8. Apparatus for monitoring the recording of information on a rotatable recording disc, comprising:
   means for providing a writing beam of light;
   means for modulating the intensity of the writing beam of light in accordance with an input information signal to be recorded;
   means for rotating the recording disc in a prescribed fashion;
   means for providing a reading beam of light;
   optical means including dichroic mirror means for combining the writing and reading beams of light and directing the two beams along substantially identical optical paths, said optical means further including an objective lens for focusing simultaneously both the writing beam and the reading beam onto the rotating recording disc;
   translational drive means, synchronized with said means for rotating, for radially translating the respective points of impingement of the writing and reading beams on the recording disc, such that the two beams scan a succession of substantially circular and concentric recording tracks;
   said writing beam of light interacts with the recording disc to record the information signal therein;
   said optical means further includes means for adjusting the relative paths of the writing and reading beams of light such that the two beams impinge on the same recording track, with the reading beam trailing the writing beam by a prescribed distance;
   said reading beam is reflected by the recording disc to produce a reflected beam that is modulated in intensity in accordance with the recorded information signal;
   means for monitoring the reflected beam of light and for producing a playback signal corresponding to its modulated intensity;
   means for delaying the input information signal by a time duration equal to the delay occurring while the apparatus records and plays back the signal and the delay occurring during movement of the recording disc by an amount corresponding to the distance between the respective points of impingement of the writing beam and reading beam on the disc;
   means for comparing the playback signal with the delayed input information signal, to produce a quantized output signal representative of the difference therebetween;
   means for counting the quantized output signal, to produce an error count signal; and
   means for comparing the error count signal to a prescribed threshold.

9. A method for monitoring the recording of information on an information storage member, comprising steps of:
   providing a writing beam of light and a reading beam of light;
   modulating the intensity of the writing beam of light in accordance with an input information signal to be recorded;
   moving the information storage member in a prescribed fashion;
   simultaneously focusing both the writing beam of light and the reading beam of light onto the information storage member using a single objective lens, the writing beam interacting with the member to record the information signal in a recording track herein, and the reading beam impinging on the recording track a prescribed distance behind the point of impingement of the writing beam and being reflected by the recording track to produce a reflected beam of light that is modulated in intensity in accordance with the recorded information signal;
   monitoring the reflected beam of light and producing a playback signal corresponding to its modulated intensity;
   delaying the input information signal; and
   comparing the playback signal with the delayed input information signal.

10. The method as claimed in claim 9, wherein:
    the information storage member is disc-shaped; and
    said step of moving includes steps of:
    producing uniform rotational motion of the disc-shaped storage member;
    translating the respective points of impingement of the writing and reading beams radially relative to the disc-shaped storage member, and
    synchronizing the translational motion with the rotational motion, to maintain a constant relationship therebetween.

11. The method as claimed in claim 9, wherein: said step of comparing produces a quantized output signal representative of the difference between the playback signal and the input information signal; and
    said method further includes a step of counting said quantized output signal to produce an error count signal.

12. The method as claimed in claim 11, further including a step of comparing the error count signal to a prescribed standard.

13. A method as defined in claim 9, wherein said step of delaying the input information signal used in said step of comparing delays the signal by a time duration equal to the delay occurring while recording and playing back the signal and the delay occurring during movement of the information storage member by an amount corresponding to the distance between the respective points of impingement of the writing beam and reading beam on the member.

14. A method as defined in claim 9, and further including a step of combining the writing and reading beams of light using dichroic mirror means, and directing the two beams along substantially identical optical paths to impinge on the information storage member.

15. A method as defined in claim 14, wherein said step of combining includes a step of adjusting the relative optical paths of the writing beam and the reading beam such that the point of impingement of the reading beam on the information storage member is the prescribed distance away from the point of impingement of the writing beam on the member.

16. A method for monitoring the recording of information on a rotatable recording disc, comprising steps of:
    providing a writing beam of light;
    modulating the intensity of the writing beam of light in accordance with an input information signal to be recorded;
    rotating the recording disc in a prescribed fashion;

providing a reading beam of light;

combining the writing and reading beams of light using dichroic mirror means and directing the two beams along substantially identical optical paths;

simultaneously focusing the writing and reading beams of light onto the rotating recording disc using a single objective lens, said focused writing beam of light interacts with the recording disc to record the information signal therein and said focused reading beam is reflected by the recording track to produce a reflected beam that is modulated in intensity in accordance with the recorded information signal;

radially translating the respective points of impingement of the writing and reading beams of light on the recording disc, in synchronism with the rotation of the disc, such that the two beams scan a succession of substantially circular and concentric recording tracks;

said step of combining includes a step of adjusting the relative optical paths of the writing beam and the reading beam such that the writing and reading beams of light impinge on the same recording track, with the reading beam trailing the writing beam by a prescribed distance;

monitoring the reflected beam of light and producing a playback signal corresponding to its modulated intensity;

delaying the input information signal by a time duration equal to the delay occurring while recording and playing back the signal and the delay occurring during movement of the recording disc by an amount corresponding to the distance between the respective points of impingement of the writing beam and reading beam on the disc;

comparing the playback signal with the delayed input information signal, to produce a quantized output signal representative of the difference therebetween;

counting the quantized output signal, to produce an error count signal; and comparing the error count signal to a prescribed threshold.

17. Apparatus for monitoring the recording of information on an information storage member, comprising:

means for providing a writing beam of light;

means for modulating the intensity of the writing beam of light in accordance with an input information signal to be recorded;

rotational drive means for rotating the disc-shaped storage member at a prescribed rate;

translational drive means, synchronized with said rotational drive means for moving the objective lens of said optical means radially to the disc-shaped storage member;

optical means including dichroic mirror means for combining the writing and reading beams of light and directing the two beams along substantially identical optical paths to impinge on the information storage member, and said optical means further including an objective lens for focusing the writing beam of light onto the information storage member, to record the information signal in a recording track therein;

means for providing a reading beam of light;

the objective lens of said optical means further operating to focus simultaneously the reading beam of light onto the recording track of the information storage member, the point of impingement of the reading beam trailing that of the writing beam by a prescribed distance, the reading beam being reflected by the recording track to produce a reflected beam of light that is modulated in intensity in accordance with the recorded information signal;

means for monitoring the reflected beam of light and for producing a playback signal corresponding to its modulated intensity;

said dichroic mirror means further directing the reflected beam of light along an optical path to impinge on said means for monitoring;

means for delaying the input information signal by a time duration equal to the delay occurring while the apparatus records and plays back the signal and the delay occurring during movement of the information storage member by an amount corresponding to the distance between the respective points of impingement of the writing beam and reading beam; and means for comparing the playback signal with the delayed information signal for determining differences in the playback signal from the delayed information signal.

18. Apparatus as defined in claim 17, wherein said optical means further includes means for adjusting the relative optical paths of the writing beam and the reading beam such that the point of impingement of the reading beam on the information storage member is the prescribed distance away from the point of impingement of the writing beam on the member.

19. A method for monitoring the recording of information on an information storage member, comprising steps of:

providing a writing beam of light and a reading beam of light modulating the intensity of the writing beam of light in accordance with an input information signal to be recorded;

moving the information storage member in a prescribed fashion;

combining the writing and reading beams of light, and directing the two beams along substantially identical optical paths to impinge on the information storage member;

simultaneously focusing both the writing beam of light and the reading beam of light onto the information storage member using a single objective lens, the writing beam interacting with the member to record the information signal in a recording track therein, and the reading beam impinging on the recording track a prescribed distance behind the point of impingement of the writing beam and being reflected by the recording track to produce a reflected beam of light that is modulated in intensity in accordance with the recorded information signal;

monitoring the reflected beam of light and producing a playback signal corresponding to its modulated intensity;

delaying the input information signal by a time duration equal to the delay occurring while recording and playing back the signal and the delay occurring during movement of the information storage member by an amount corresponding to the distance between the respective points of impingement of the writing beam and reading beam on the member; and comparing the playback signal with the delayed input information signal for determining the differences in the playback signal and the delayed information signal.

20. A method as defined in claim 19, wherein said step of combining includes a step of adjusting the relative optical paths of the writing beam and the reading beam such that the point of impingement of the reading beam on the information storage member is the prescribed distance away from the point of impingement of the writing beam on the member.

* * * * *